United States Patent
Nokiyama

(10) Patent No.: US 6,967,647 B2
(45) Date of Patent: Nov. 22, 2005

(54) METHOD OF CONTROLLING DISPLAY BRIGHTNESS OF PORTABLE INFORMATION DEVICE, AND PORTABLE INFORMATION DEVICE

(75) Inventor: Takayuki Nokiyama, Tokyo (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 39 days.

(21) Appl. No.: 10/335,152

(22) Filed: Jan. 2, 2003

(65) Prior Publication Data

US 2004/0130556 A1 Jul. 8, 2004

(51) Int. Cl.[7] .............................. G09G 3/34; G09G 5/00
(52) U.S. Cl. ........................ 345/204; 345/601; 345/77; 345/211
(58) Field of Search ............................... 345/617, 204, 345/207, 209, 210, 211, 84, 87, 95, 96, 601, 345/549, 77

(56) References Cited

U.S. PATENT DOCUMENTS 5,854,617 A * 12/1998 Lee et al. ................... 345/102
6,574,740 B1 * 6/2003 Odaohhara et al. ......... 713/323
2003/0001813 A1 * 1/2003 Sekiguchi .................... 345/96
2003/0149526 A1 * 8/2003 Zhou et al. .................. 701/213
2003/0234778 A1 * 12/2003 Kim ........................... 345/204

FOREIGN PATENT DOCUMENTS

JP 11-153826 6/1999

OTHER PUBLICATIONS

"New Fujitsu iPAD brings retailing to the palm of your hand"; Fujitsu Transaction Solutions, Inc.; Press Release dated Jan. 13, 2002 (2 pages).

* cited by examiner

Primary Examiner—Matthew C. Bella
Assistant Examiner—Wesner Sajous
(74) Attorney, Agent, or Firm—Armstrong, Kratz, Quintos, Hanson & Brooks, LLP

(57) ABSTRACT

A battery voltage detector detects a voltage of a battery, a battery alarm voltage detector detects whether the voltage of the battery has dropped to a battery alarm voltage, a near-battery alarm voltage detector detects whether the voltage of the battery has dropped to a near-battery alarm voltage, and a display brightness control unit decreases the brightness of a display unit if the near-battery alarm voltage detector detects that the voltage of the battery has dropped to a near-battery alarm voltage.

2 Claims, 12 Drawing Sheets

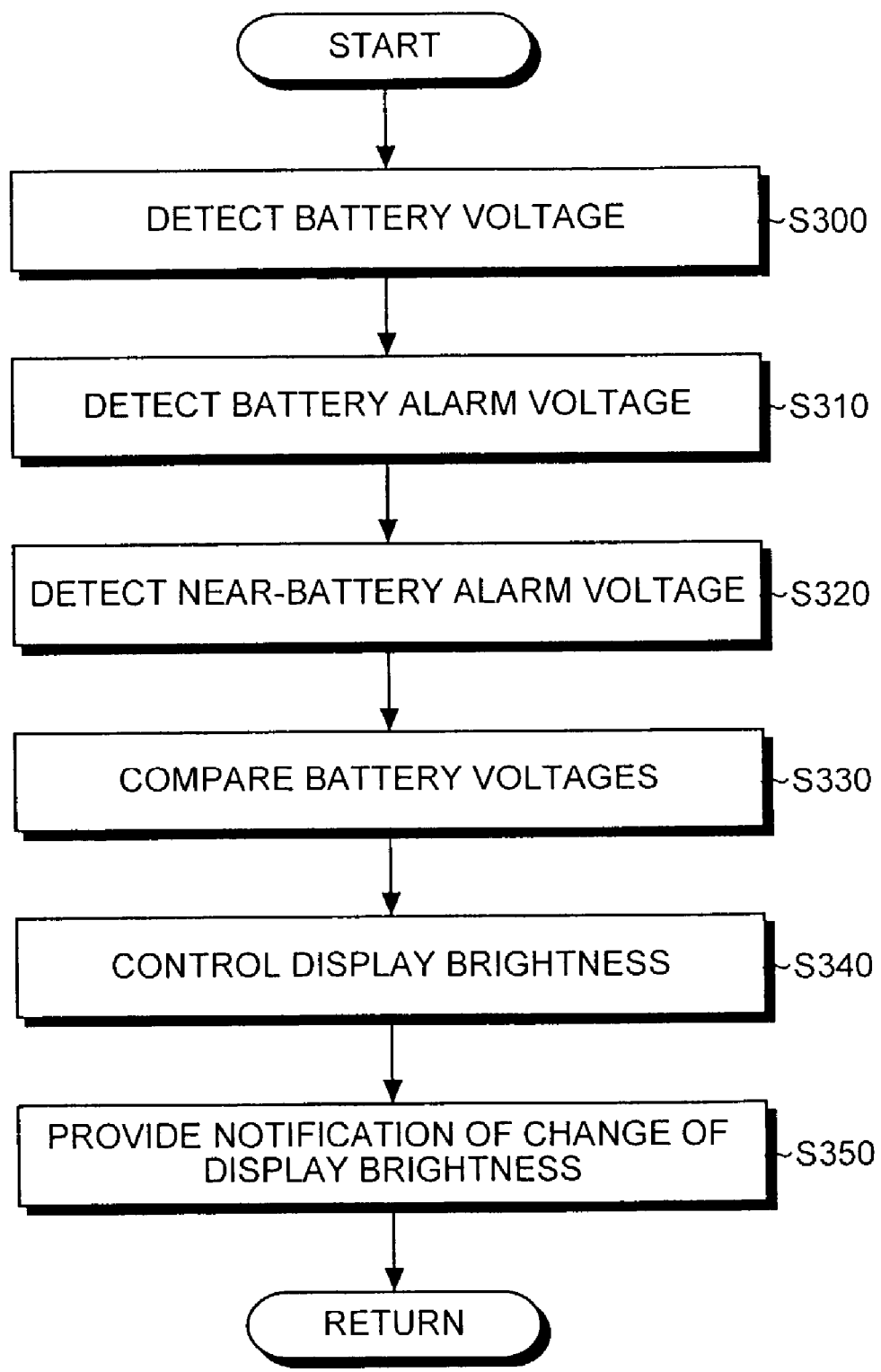

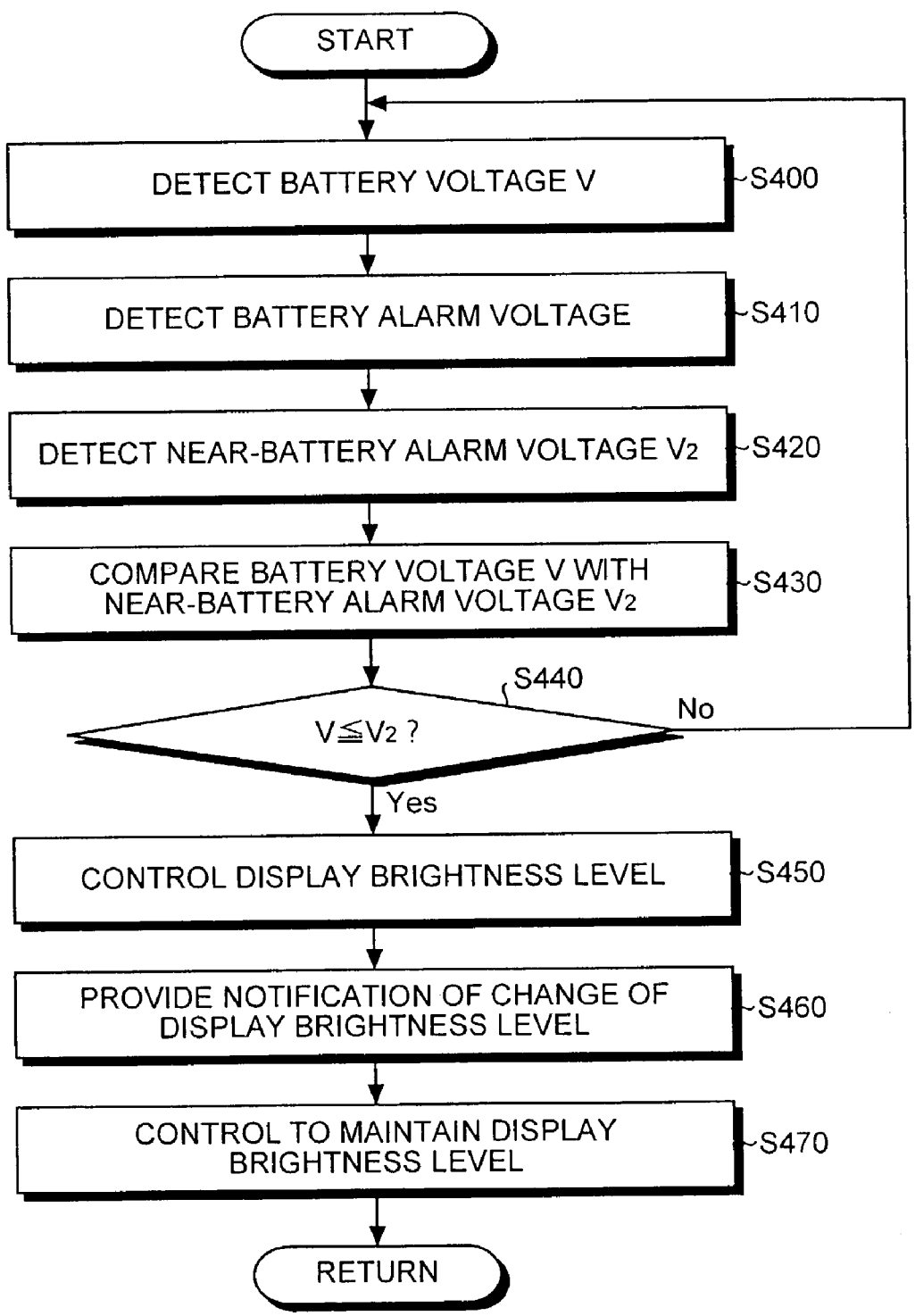

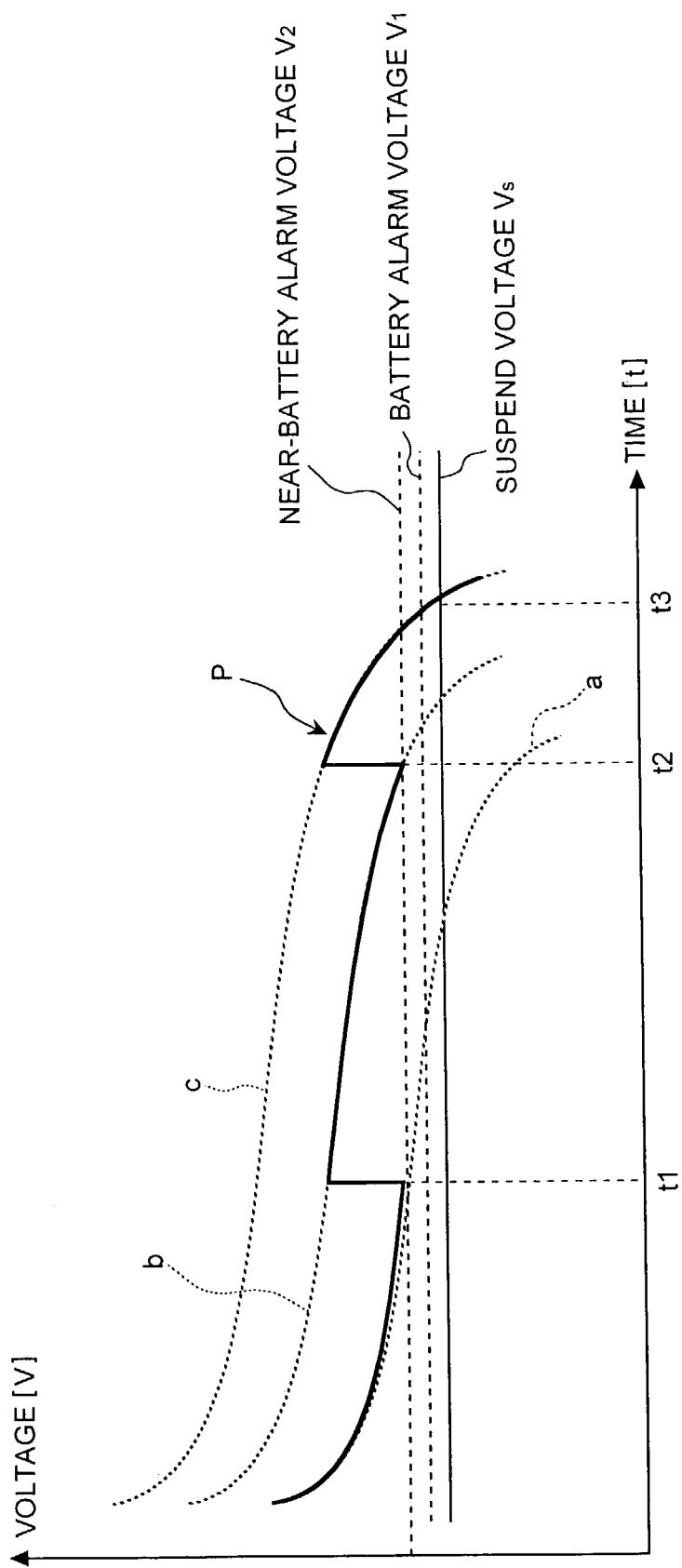

FIG.9

| DEVICE | VOLTAGE DROP [V] |
|---|---|
| BLUETOOTH | 0.1 |
| WIRELESS LAN CARD | 0.1 |
| ⋮ | ⋮ |
| ⋮ | ⋮ |
| ⋮ | ⋮ |

| RISE IN BATTERY VOLTAGE [V] DUE TO FALL OF BRIGHTNESS OF DISPLAY | CHANGE OF BRIGHTNESS LEVEL |
|---|---|
| 0.1 | MAX→NORMAL |
| 0.2 | MAX→DARK |
| 0.3 | MAX→OFF |
| 0.1 | NORMAL→DARK |
| 0.2 | NORMAL→OFF |
| 0.1 | DARK→OFF |

310

METHOD OF CONTROLLING DISPLAY BRIGHTNESS OF PORTABLE INFORMATION DEVICE, AND PORTABLE INFORMATION DEVICE

BACKGROUND OF THE INVENTION

1) Field of the Invention

The present invention relates to a technology for automatically controlling a brightness level of a display unit in a portable information device according to the remaining capacity of a battery.

2) Description of the Related Art

In recent years, the portable information devices have been widely used as notebook-size personal computers, personal digital assistants (PDA), electronic personal organizers, or cellular phones, as mobile tools. In particular, the PDA has another function as a terminal dedicated to the Internet, and therefore the PDA is widely used as the mobile tool for managing emails and schedules on individual base. The PDA usually uses a battery in the same manner as that of the notebook-size personal computer as a portable.

Continuous use of the PDA in a state where the remaining capacity of the battery is low causes a problem to occur such that data in use may be lost. Therefore, some measures against the problem are taken by displaying a warning about the remaining capacity of the battery on a display or by sounding an alarm according to the remaining capacity of the battery. In particular, the display unit is provided with a most power-consuming backlight, and as a measure to solve this problem, a technology for controlling the power consumed by the backlight has been disclosed in Japanese Patent Application Laid-Open Publication No. 11-153862. According to the technology disclosed in this publication, the display brightness level of the display unit can freely be controlled through manual operation.

However, the conventional PDA or portable information device has various problems as follows. That is, in the PDA, if the display brightness level of the backlight is increased, then the visibility improves. On the other hand, the increase in the brightness by the backlight results in an increase in power consumption, as explained above.

Conventionally, even if the remaining capacity of the battery is decreased due to continuous use of the PDA, the level (voltage) of the display brightness of the display unit that largely consumes power is not changed and the operation is continued as it is. Therefore, setting of the display brightness level of the display unit to a maximum causes the power consumption of the battery to be increased, thus reducing operating time of the PDA.

Further, considering the power consumed by any device built inside the PDA or provided on periphery of the PDA, a battery voltage drops due to the load of the device when the device is activated (turned on from off). Therefore, a warning about the battery voltage level is frequently displayed because of this abrupt voltage drop, which causes the operating time of the PDA to be extremely reduced as a result.

The display brightness level and transition of the operating time (t) due to operation of the device will be explained below with reference to FIG. 12 and FIG. 13. FIG. 12 shows discharge curves by respective levels of the display brightness in the conventional art. The Y axis shows fluctuations in a battery voltage V, and the X axis shows changes of the operating time (t) by the battery. A battery alarm voltage V1 indicates a level of the voltage with which a warning about a decreased remaining capacity of the battery is given, and a suspend voltage Vs indicates a level of the voltage with which the operation of the PDA is suspended due to the decreased remaining capacity of the battery.

A discharge curve "a" denotes display brightness of the display unit when it is set to a maximum level (MAX), a discharge curve "b" denotes display brightness of the display unit when a normal level (normal), and a discharge curve "c" denotes display brightness of the display unit when a lowest level (dark).

In other words, regarding the operating time of the battery when the display brightness is set to the "maximum" based on the discharge curve "a", it is found that the remaining capacity of the battery drops to the alarm voltage V1 after t1-second passes and further drops to the suspend voltage Vs after t2-second passes. This t2-second refers to a useful operating time of the battery when the display brightness is set to "MAX".

Likewise, regarding the operating time of the battery when the display brightness is set to the "normal" and "dark" based on the discharge curves "a" and "c", it is found that each remaining capacity of the battery in these cases drops to the alarm voltage V1 after t3-second and t5-second pass, respectively, and further drops to the suspend voltage Vs after t4-second and t6-second pass, respectively.

More specifically, when the display brightness is set to the maximum level (MAX), the useful operating time is indicated by t2, when the normal level (normal), the useful operating time is indicated by t5, and when the lowest level (dark), the useful operating time is indicated by t6 (t2<t4<t6). As explained above, because there is a difference between discharge levels of the battery depending on the setting of the display brightness level, a difference is produced between the useful operating times of the portable information device. Particularly, when the display brightness level is set to the maximum, the operating time of the battery-operated portable information device tends to be reduced.

In FIG. 13, reference sign a1 refers to a discharge curve with an abrupt drop when a device is turned on from off. Reference sign a2 refers to a normal discharge curve when a device is not activated. That is, referring to the discharge curve a1 when the display brightness is set to the lowest level (dark) as shown in FIG. 13, it is found that if a device is turned on from off after the time t1 passes, then the battery voltage abruptly drops to a value lower than a battery alarm voltage due to the load.

Therefore, the operating time is disadvantageously reduced to t2 due to a voltage drop in response to turning on of the device though the useful operating time is supposed to be t3 in the normal level. Further, according to the discharge curve a3, it is found that the remaining capacity of the battery instantly drops to the suspend voltage when the load of the device is extremely heavy.

SUMMARY OF THE INVENTION

According to the present invention, brightness of a display unit of a portable information device is controlled by detecting a voltage of the battery; and controlling the brightness of the display unit based on the detected battery voltage. For example, if the voltage of the battery drops below a certain voltage then the brightness is decreased so that the display unit consumes less power. On the other hand, if the voltage of the battery increases due to recharging or the like, then the brightness that was decreased is increase so that the visibility of the display unit improves.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 3 shows a flowchart of an overall processing sequence of the method of controlling display brightness according to this invention, FIG. 4 shows a flowchart of an overall processing sequence of a method of controlling display brightness according to a first embodiment of this invention, FIG. 5 shows changes of discharge curves in time sequence when the first embodiment is applied, FIG. 9 shows a device voltage storage table, FIG. 10 shows a display brightness level determination table.

DETAILED DESCRIPTIONS

Exemplary embodiments of the apparatus and method of controlling display brightness of a display unit in a portable information device according to the present invention will be explained in detail below with reference to the accompanying drawings.

Figure 1:
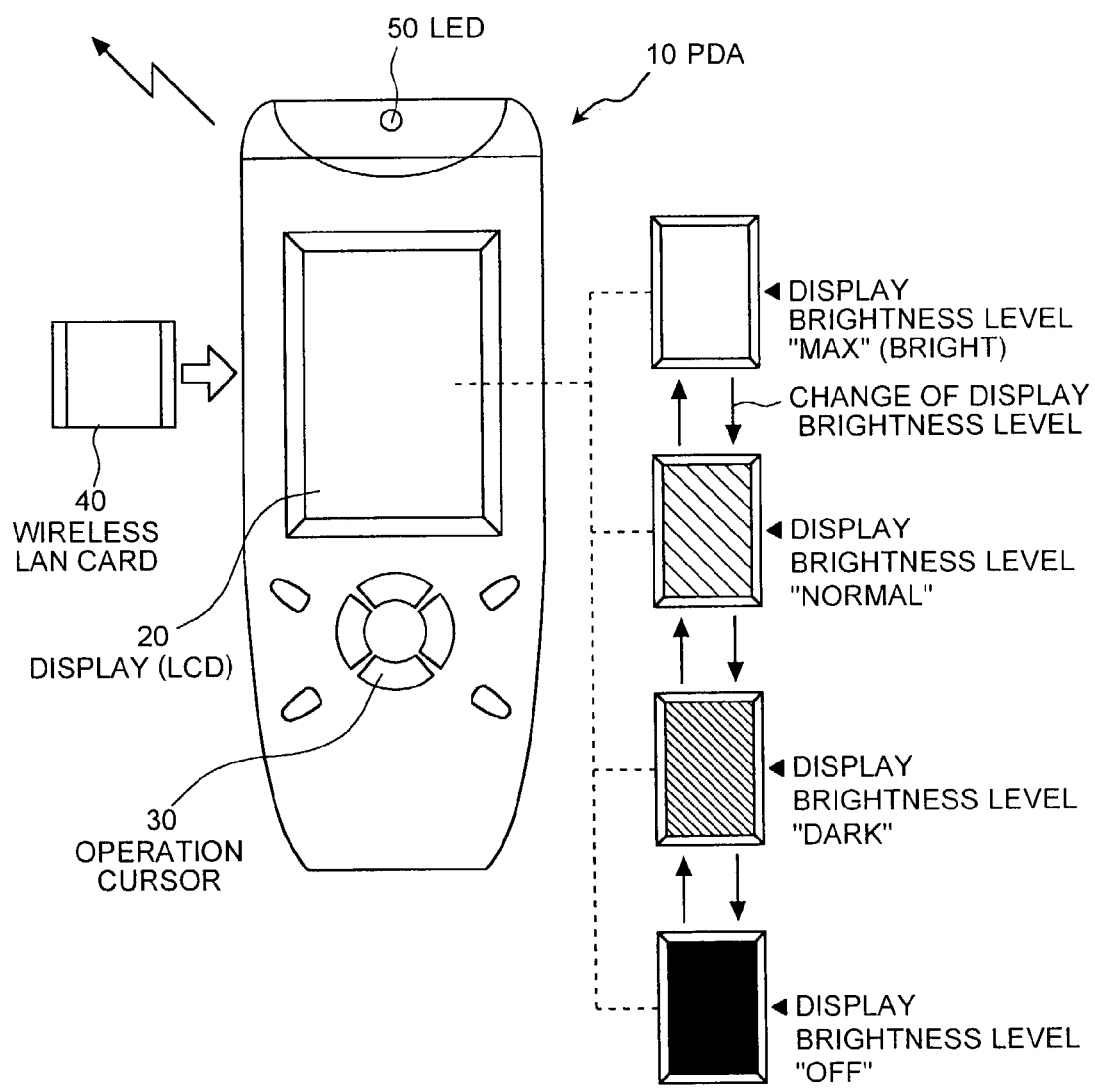
FIG. 1 shows a schematic configuration of an overall PDA (portable information device) to which this invention is applied.

A first embodiment of this invention will be explained below. FIG. 1 shows the schematic configuration of the overall portable information device to which this invention is applied.

Characteristics of the apparatus and method of controlling display brightness of the portable information device according to this invention will be briefly explained first with reference to the overall configuration of FIG. 1. That is, a personal digital assistant (PDA) 10 as a target of this invention is compact in size so that a user can carry the PDA 10, and can be operated by an AC power supply or a battery.

A display 20 for displaying data using a light source, for example, by a backlight, is provided on a top part of the main body of the PDA 10, and a cross-shaped cursor 30 for operation is provided at around a central part of the PDA 10. Further, the PDA 10 is provided with a light emitting diode (LED) 50 for displaying a message for a user by lighting up or flashing on and off. This invention is configured to extend an operating time of the battery-operated PDA 10 by automatically controlling the display brightness level of the display 20 according to the remaining capacity of the battery.

More specifically, if the display brightness of the display 20 is set, for example, to four levels, then the display brightness can be automatically controlled according to the capacity of the battery remaining as the battery is discharged, by being set to the four levels: maximum level (MAX), normal level (normal), lowest level (dark), and display brightness being OFF. When the battery is fully charged, control can also be exercised to automatically increase the display brightness level in each predetermined level (in each one level).

Figure 2:
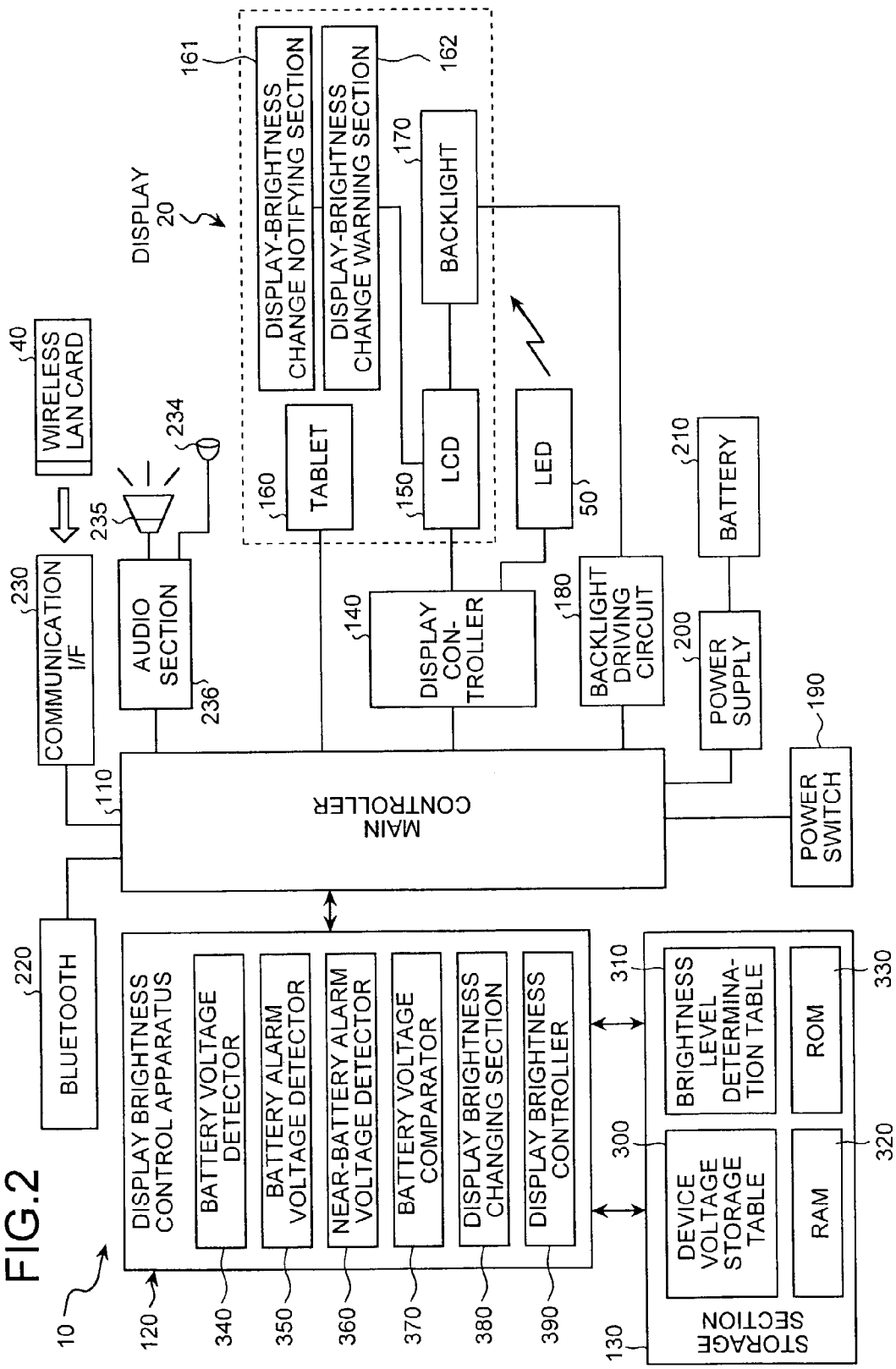
FIG. 2 shows a functional block diagram of the configuration of the portable information device according to this invention.

FIG. 2 shows a block diagram of the system configuration of a portable information device according to the first embodiment. As shown in FIG. 1, the PDA 10 (portable information device) of the first embodiment comprises a main controller 110, a display brightness control apparatus 120, a storage section 130, a display controller 140, a liquid crystal display (LCD) 150, a tablet 160, a backlight 170, a backlight driving circuit 180, a power switch 190, a power supply 200, a battery 210, a communication interface 230 using a Bluetooth 220 and a wireless local area network (LAN) card 40, and an audio section 236 provided with a microphone 234 that inputs speech and a speaker 235 that outputs speech. The storage section 130 comprises a device voltage storage table 300, a display brightness level determination table 310, a random access memory (RAM) 320, a read only memory (ROM) 330.

The display brightness control apparatus 120 has a function of controlling a display brightness level by the backlight based on fluctuations in battery voltage. This apparatus 120 comprises a display brightness controller 390, a battery voltage detector 340, a battery alarm voltage detector 350, a near-battery alarm voltage detector 360, a battery voltage comparator 370, and a display brightness changing section 380.

The battery voltage detector 340 has a function of detecting a voltage of the battery that decreases as the battery is discharged. The battery alarm voltage detector 350 has a function of detecting a voltage that drops to a predetermined voltage in association with the discharge of the battery, as an alarm voltage. When the remaining capacity of the battery reaches the alarm voltage, a warning about the alarm voltage is given.

The near-battery alarm voltage detector 360 has a function of detecting a voltage near reaching the battery alarm voltage, as a near-battery alarm voltage. The battery voltage comparator 370 has a function of comparing the battery voltage detected by the battery voltage detector 340 with the near-battery alarm voltage detected by the near-battery alarm voltage detector 360.

The storage section 130 has a function of storing programs executed by the main controller 110 and various types of data. The RAM 320 is used as ordinary memory, and the ROM 330 stores a screen control program and application programs used to execute various kinds of processing.

The device voltage storage table 300 stores a drop of the battery voltage when a corresponding device of devices is activated. The display brightness level determination table 310 stores levels of rise in the battery voltage according to change of the display brightness level.

The display-brightness change notifying section 161 has a function of notifying the display 20 of change of the display brightness by a message or the like. The display-brightness change warning section 162 has a function of giving a warning about prohibition of change of the display brightness to the display 20 when the display brightness is to be changed. Thus, it is possible to provide useful power savings particularly when a high level of the display brightness is not required.

The display 20 comprises the LCD 150, the tablet 160, and the backlight 170. The backlight driving circuit 180 has a function of driving the backlight 170 according to an instruction of a setting level from the main controller 110 to emit light. The backlight 170 is a light source provided in the LCD 150 and is driven by the backlight driving circuit 180.

The tablet 160 has a function of inputting instructions for operation to the display or image patterns. For example, a tablet of pressure-sensitive type is used for this tablet 160. The tablet 160 is configured to be transparent so that light can pass through the tablet 160, and to be integrated with a display screen of the LCD 150 by being laminated.

The power supply 200 has a function of supplying power to the PDA 10 for activation when the power switch 190 is turned on. A lithium battery, for example, is used for the battery 210.

The communication interface 230 is an interface used to establish wireless connection with any other wireless communication device such as a cellular phone or a personal handyphone system (PHS). This interface is used to transmit various pieces of information such as data for an image captured, for example, by a camera to the outside through wireless communication.

FIG. 3 shows a flowchart of the configuration of overall control in the method of controlling display brightness of the portable information device according to this invention. That is, the method includes six processing steps of: (1) detecting a battery voltage (step S300), (2) detecting a battery alarm voltage (step S310), (3) detecting a near-battery alarm voltage (step S320), (4) comparing battery voltages (step S330), (5) controlling display brightness (step S340), and (6) providing notification of change of display brightness (step S350). Each of the processing steps of (1) to (6) will be briefly explained below.

(1) The step of detecting a battery voltage is the processing for detecting a battery voltage, as a voltage fluctuating (dropping) as the battery is discharged.

(2) The step of detecting a battery alarm voltage is the processing for measuring a battery voltage. When a battery voltage drops lower than the battery alarm voltage, the voltage reaches a suspend voltage, and when the battery voltage drops (is discharged) to the suspend voltage, the portable information device suspends its operation.

(3) The step of detecting a near-battery alarm voltage is the processing for detecting a voltage near reaching the battery alarm voltage, as a near-battery alarm voltage before the voltage reaches the battery alarm voltage. The voltage that drops lower than the near-battery alarm voltage reaches the alarm voltage.

(4) The step of comparing battery voltages is the processing for comparing the battery voltage detected in the battery voltage detecting step with the near-battery alarm voltage detected in the near-battery alarm voltage detecting step, and controlling the display brightness based on the result of comparison.

(5) The step of controlling display brightness is the processing for controlling the display brightness level by the backlight based on fluctuations in the battery voltage. Controlling the display brightness in the display brightness controlling step is decreasing the set display brightness level by one level.

(6) The step of providing notification of change of display brightness is the processing for notifying or warning the user of change of the display brightness level in the display brightness controlling step by a message displayed on the display or an LED that flashes on and off.

Figure 6A:
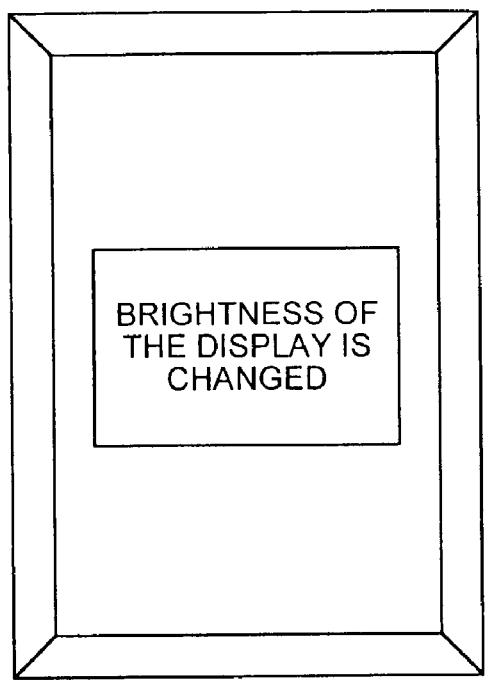
FIG. 6A shows an example of notification by a message displayed on a display.
Figure 6B:
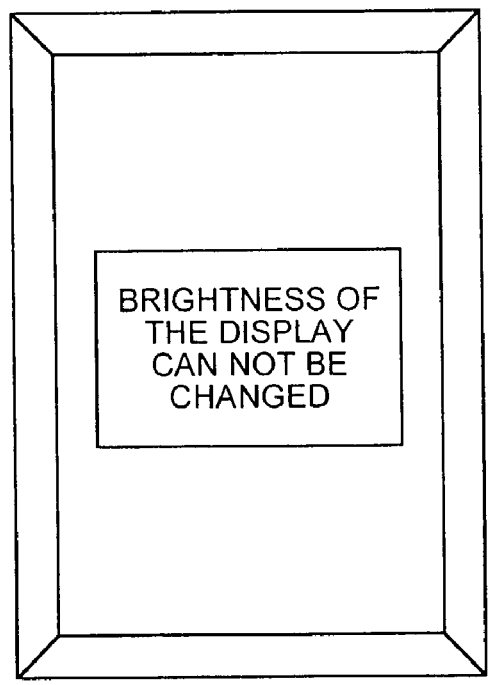
FIG. 6B shows an example of a warning.

The method of controlling display brightness control of the portable information device according to this invention will be explained in detail below with reference to FIG. 4 to FIG. 6A and FIG. 6B. FIG. 4 shows a flowchart of a processing sequence of the display brightness control method, and FIG. 5 shows changes of discharge curves in time sequence when the first embodiment is applied. FIG. 6A and FIG. 6B show examples of notification and a warning by a message displayed on the display, respectively.

That is, as shown in the flowchart of FIG. 4, the battery voltage detector 340 detects a battery voltage V (step S400). The battery alarm voltage detector 350 detects a battery alarm voltage V1 (step S410), and the near-battery alarm voltage detector 360 detects a near-battery alarm voltage V2 (step S420). As explained above, the battery alarm voltage V1 is the voltage with which a warning about the decrease in the remaining capacity of the battery is given. The near-battery alarm voltage V2 is the voltage near reaching the battery alarm voltage V1.

The battery voltage V and the near-battery alarm voltage V2 detected in step S400 to step S420 are compared with each other (step S430). The battery voltage comparator 370 carries out this comparison. More specifically, it is determined whether the battery voltage V drops to the near-battery alarm voltage V2 (step S440). If it is determined at step S440 that the battery voltage V drops to the near-battery alarm voltage V2 (step S440, Yes), it is controlled to decrease the display brightness level (step S450). More specifically, the display brightness changing section 380 controls so as to decrease the set display brightness level by one level.

As explained above, the setting of the display brightness level is explained using the example of the four levels: the maximum level (MAX), normal level (normal), lowest level (dark), and display brightness being OFF. Therefore, if the display brightness level is initially set to "MAX", then the display brightness changing section 380 sets the display brightness level to "normal". As can be seen, the load of the battery can be reduced by controlling to decrease the display brightness level according to the remaining capacity of the battery due to discharge of the battery. Thus, it is possible to extend the operating time of the PDA 10 (portable information device).

The processing for the display brightness level at step S450 will be explained in detail below with reference to FIG. 5. In FIG. 5, the discharge curves "a", "b", and "c" represent discharge curves when the display brightness level is set to the maximum level (MAX), the normal level (normal), and the lowest level (dark), respectively. A discharge curve P indicated by a heavy line shows a discharge curve based on the method of controlling display brightness according to this invention.

Referring to the discharge curve "a", for example, when the MAX is set, the battery voltage V drops to the near-battery alarm voltage V2 as the PDA 10 is operated after the time t1 passes. Therefore, the passage of the time t1 is determined by "V≦V2" at step S440, and if the battery voltage V is close to or below the near-battery alarm voltage V2, then the display brightness controller 390 controls to decrease the display brightness level by one level.

As shown in FIG. 5, in such a manner, the operating time can be extended with this battery voltage V as far as a time after the time t2 passes. The operating time can be further extended as far as a time after the time t2 to t3 passes if the display brightness controller 390 controls to further decrease the display brightness level by one level even after passage of the time t2.

Referring again to the flowchart of FIG. 4, the display brightness level is controlled at step S450, and then it is notified at step S460 that the display brightness level has been changed (step S460). The notification is targeted to a user. At step S470, continuous control is exercised to maintain the set display brightness level.

The display brightness level of the display 20 (FIG. 1) can be changed through setting operation by the user. Therefore, there is likelihood that the user may manually operate again the setting to increase the brightness when the display brightness level is decreased by one level according to control of the display brightness level at step S450. In this case, the battery voltage may reach the near-battery alarm voltage V2 or the battery alarm voltage, and therefore, in this invention, notification is provided at step S460 to prohibit the user from increasing the display brightness level.

FIG. 6A shows a specific example of notification provided by the display-brightness change notifying section 161 (FIG. 2), and FIG. 6B shows a specific example of a warning given by the display-brightness change warning section 162 (FIG. 2). That is, the example shown in FIG. 6A shows the notification to the display 20 by a message indicating "the brightness of the display is changed". The notification by the message to the display 20 is actually provided when the display brightness control apparatus 120 has decreased the display brightness level. The case of providing this notification is applied, for example, to a case where the setting of the display brightness level is changed from "normal" to the level of OFF. A means of providing the notification may include a notification method by lighting up (flashing on and off) of the display 20, lighting up (flashing on and off) of the LED 50, or speech through a speaker, other than the notification by the message.

In the example of FIG. 6B, a warning by the message indicating "the brightness of the display cannot be changed" is displayed on the display 20. The warning by the message is actually given to the display 20 when the user decreases the display brightness level through manual operation. The case of giving this warning is applied, for example, to a case where the user changes the setting of the display brightness level from OFF to "normal". A means of giving the warning, like the case of the notification, may includes a warning method by lighting up (flashing on and off) of the display 20, lighting up (flashing on and off) of the LED 50, or speech through a speaker, other than the warning by the message. Further, if it is predicted that the voltage will drop to the near-battery alarm voltage V2 or battery alarm voltage V1 when the wireless LAN card 40 is used, a warning about this effect may be displayed on the display 20.

As explained above, in the first embodiment, the display brightness level of the display can be automatically controlled by the display brightness control apparatus 120 according to the discharge level of the battery. Further, it is possible to prevent the user from changing the display brightness level through manual operation by notifying the display 20 of the change of the level when the display brightness level is to be controlled (changed).

A second embodiment of this invention will be explained below. In the first embodiment, the display brightness control apparatus 120 is configured to control the display brightness level according to discharge of the battery and then notify the display 20 of the change of the display brightness level. However, the second embodiment is characterized in that a warning about prohibition of the change of the display brightness level is given to the user and it is controlled not to increase the display brightness level to a level higher than the set display brightness level when the display brightness level is manually changed.

Figure 7:
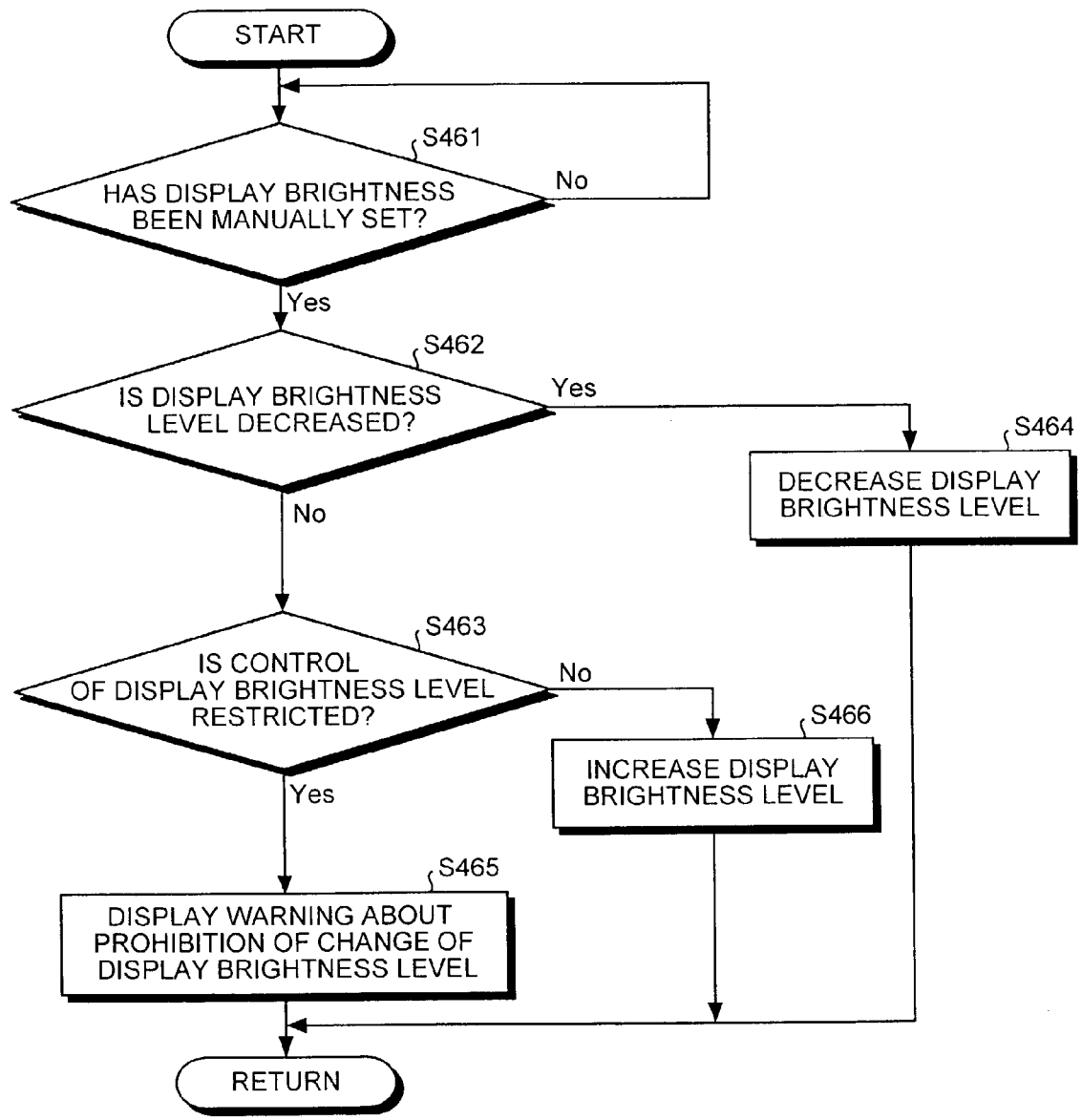
FIG. 7 shows a flowchart of an overall processing sequence of a method of controlling display brightness according to a second embodiment of this invention.

The processing sequence of a method of controlling display brightness according to the second embodiment will be explained below. FIG. 7 shows a flowchart of the processing sequence of the method according to the second embodiment.

As shown in the flowchart of FIG. 7, at step S461, it is determined whether the user has manually set the display brightness level (step S461). If the display brightness level has manually been set (step S461, Yes), then it is determined at step S462 whether the display brightness level is decreased through the manual operation (step S462).

If it is determined at step S462 that the display brightness level is not decreased through the manual operation (step S462, No), then, it is determined whether the control of the display brightness level is being restricted (step S463). The restriction to the control of the display brightness level is control to decrease the display brightness level when the battery voltage V drops to the near-battery alarm voltage V2, as explained at step S450. On the other hand, if it is determined as step S462 that the display brightness level is decreased through the manual operation by the user (step S462, Yes), then it is controlled to decrease the display brightness level without any restriction (step S464).

Referring again to step S463, if it is determined at step S463 that the control of the display brightness level is restricted (step S463, Yes), the warning about prohibition of the change of the display brightness level is displayed on the display 20 (FIG. 2) (step S465). Further, if it is determined at step S463 that the control of the display brightness level is not restricted (step S463, No), then it is controlled to increase the display brightness level (step S467). Accordingly, it is possible to restrict the control of the display brightness level through manual operation by the user and to reliably prevent drop of the battery voltage due to increase in the display brightness level.

As explained above, in the second embodiment, the display brightness control apparatus 120 automatically controls the display brightness level of the display according to the discharge level of the battery. Further, it is possible to reliably prevent change of the display brightness level through manual operation by the user by displaying notification indicating the prohibition of the change of the level on the display 20 when the display brightness level is to be controlled (changed).

A third embodiment of this invention will be explained below. The third embodiment is characterized in that, when any of devices built inside the PDA 10 is activated (turned on from off), it is predicted how the battery voltage drops due to influence of the device, and it is controlled so that the display brightness level corresponding to a voltage that drops is decreased in advance.

Figure 8:
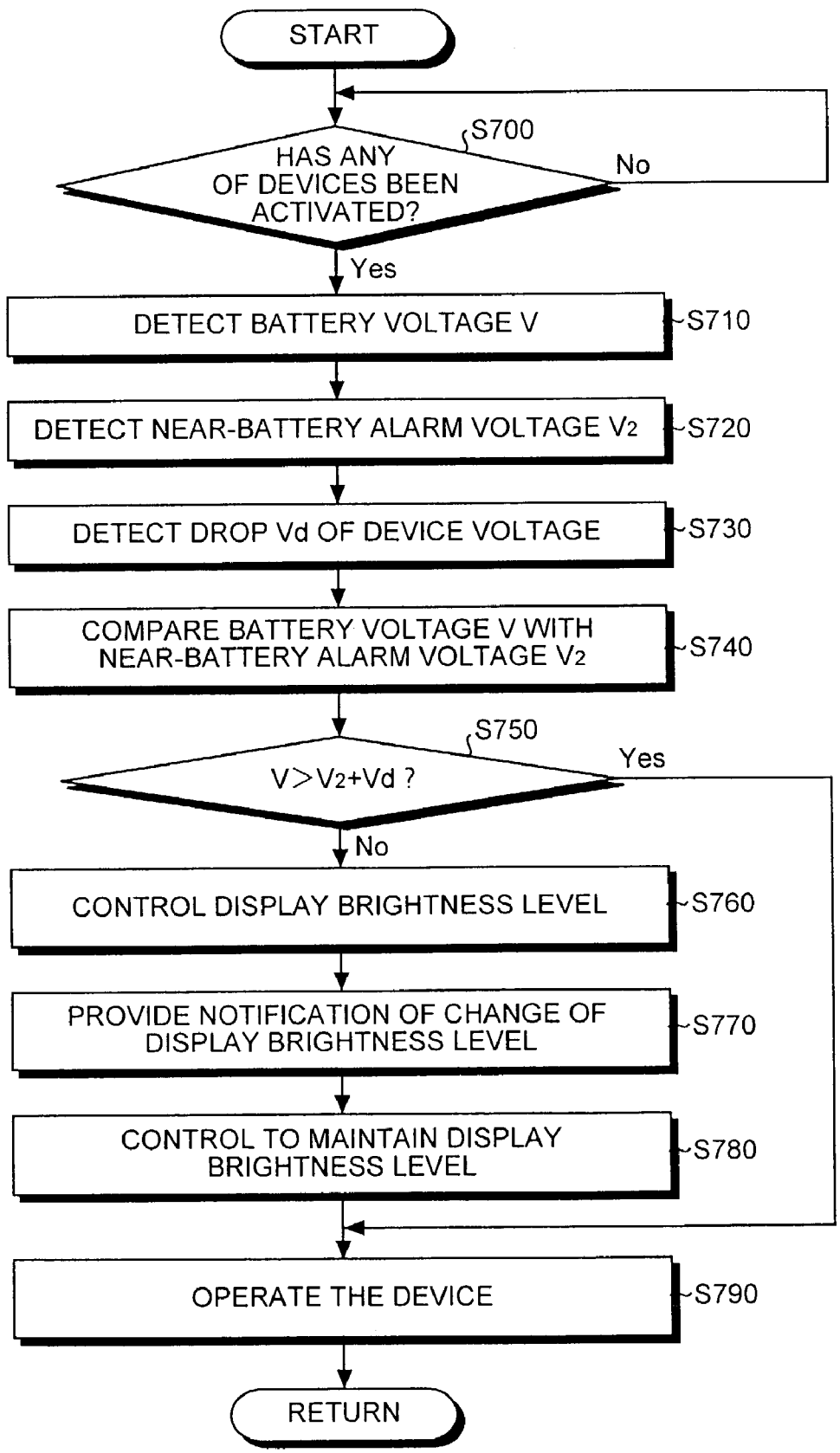
FIG. 8 shows a flowchart of an overall processing sequence of a method of controlling display brightness according to a third embodiment of this invention.

The processing sequence of a method of controlling display brightness according to the third embodiment will be explained below. FIG. 8 shows a flowchart of the processing sequence of the method according to the third embodiment. FIG. 9 shows the device voltage storage table 300 that stores drop levels of the voltage when a corresponding device of devices is activated.

FIG. 10 shows the display brightness level determination table that stores variable values of the battery voltage (rise/drop of voltage) due to the change of the display brightness level. More specifically, as shown in FIG. 10, if the display brightness level set to "MAX" is changed to the level of "normal", then the battery voltage V rises by 0.1 V as the display brightness level is decreased. On the contrary, if the display brightness level set to "dark" is changed to the level of "normal", then the battery voltage V drops by 0.1 V as the display brightness level is increased.

As shown in the flowchart of FIG. 8, it is determined whether any of devices built inside the PDA 10 (FIG. 1) has been activated (turned on from off) (step S700). When the device has been activated (step S700, Yes), the battery voltage V is detected by the battery voltage detector 340 (step S710), and the near-battery alarm voltage V2 is detected by the near-battery alarm voltage detector 360 (step S720). Further, a drop Vd of the voltage in response to activation of the corresponding device is detected (step S730).

More specifically, by searching for the activated device and referring to the device voltage storage table 300, a drop of the voltage due to the device is extracted. As shown in the device voltage storage table 300 of FIG. 9, if the device is Bluetooth, then it is found that the voltage drop when the Bluetooth 220 is activated is 0.1 V.

At step S740, the battery voltage V is compared with the near-battery alarm voltage V2. More specifically, it is determined whether the battery voltage V is higher than the near-battery alarm voltage V2 when the device is activated (step S750).

That is, a relationship between the near-battery alarm voltage V2 and the battery voltage V when the device is turned on, is expressed by "V2<V−Vd" where a value of the voltage drop in response to turning on of the device is Vd. Further, this expression becomes "V>V2+Vd" according to modification of the expression. Therefore, the battery voltage V is controlled so that the battery voltage V is always kept higher than the voltage level obtained by summing the near-battery alarm voltage V2 and the value of the voltage drop in response to turning on of the device.

This comparison/determination is a comparing step of determining whether the battery voltage V drops to the near-battery alarm voltage V2 under the influence of voltage drop produced in response to activation of the device, and this step is carried out by the battery voltage comparator 370.

At step S750, if it is determined that the relationship is not "V>V2+Vd" (step S750, No), then it is predicted that the battery voltage V will be closer to the near-battery alarm voltage V2 by the voltage drop when the device is turned on. Therefore, at step S760, the display brightness level is controlled. The processing sequence at step S760 is such that it is predicted based on a relational expression how much the battery voltage V drops when the device is turned on, to control so as to decrease the display brightness level in advance by a level corresponding to the predicted voltage drop.

More specifically, a rise Vh in the battery voltage due to the change (decrease) of the display brightness level is calculated by "Vh>V−V2−Vd". The display brightness level is determined through calculation using "Vh>V−V2−Vd" and by referring to the display brightness level determination table 310. To be more specific, assuming that the near-battery alarm voltage V2 is 3.6 V, the battery voltage V is 3.8 V, and the voltage drop Vd in response to turning on of the device is 0.1 V, the rise in the battery voltage due to fall of the display brightness level becomes "3.8 V−3.6 V−0.1 V=0.1 V" if the display brightness level is currently set to "MAX".

For the rise in the calculated battery voltage, if a voltage higher than 0.1 V is obtained by referring to the display brightness level determination table 310, then the rise in the battery voltage V is obtained as 0.2 V because the current display brightness level is set to "MAX", and it is controlled to change the setting of the display brightness level from "MAX" to "dark".

At step S760, the display brightness level has been controlled, and at step S770, it is notified that the display brightness level has been changed. As explained above, this notification is targeted to the user. At step S780, continuous control is carried out to maintain the set display brightness level and then the device is operated (step S790).

As explained above, in the third embodiment, when a device is activated (turned on from off), it is predicted how much the battery voltage drops due to influence of the device, and it is controlled in advance to decrease the display brightness level to a level corresponding to the voltage drop. Therefore, it is possible to prevent the portable information device from suspension of its operation due to abrupt voltage drop in response to turning on of the device.

Figure 11:
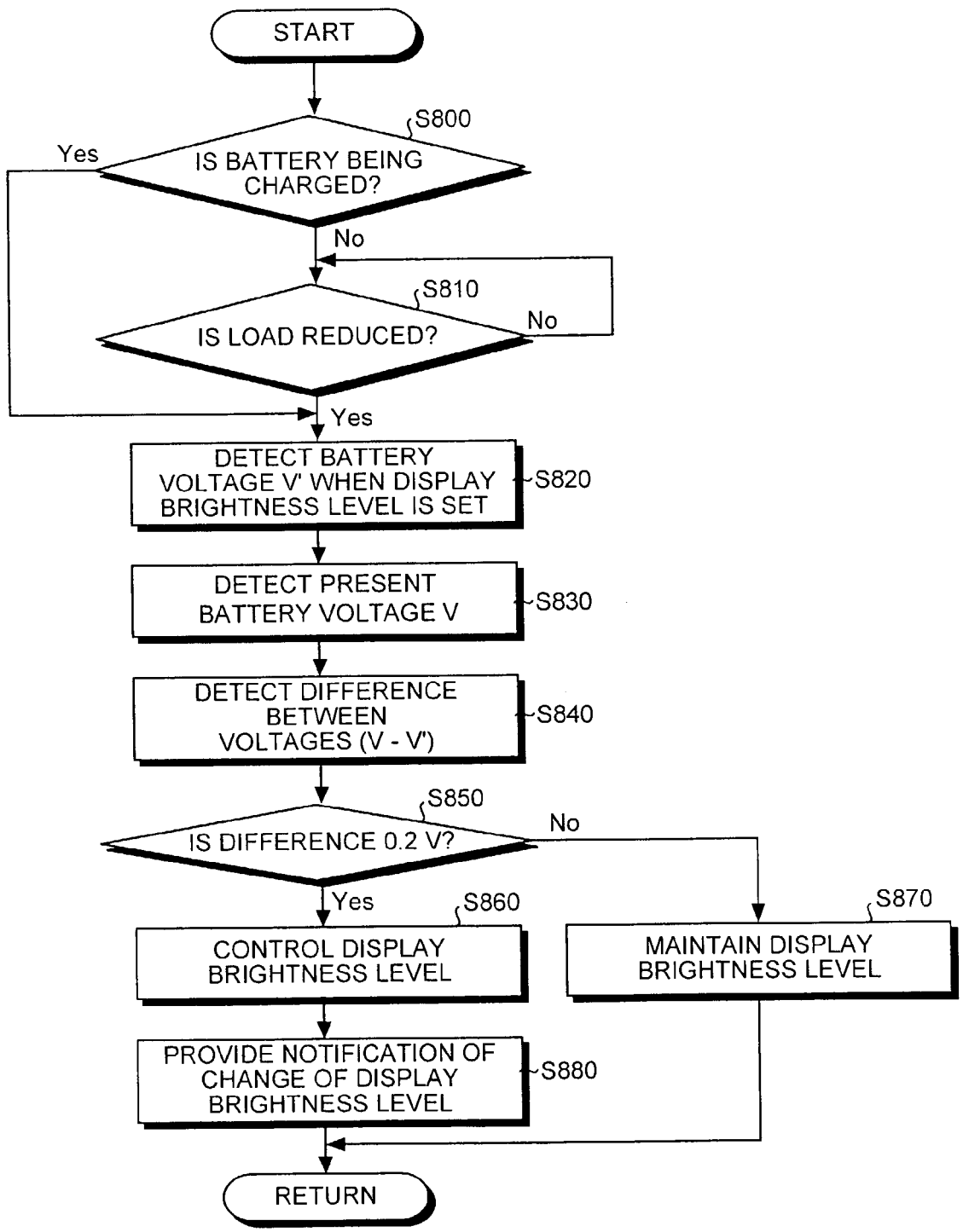
FIG. 11 shows a flowchart of an overall processing sequence of a method of controlling display brightness according to a fourth embodiment of this invention.
Figure 12:
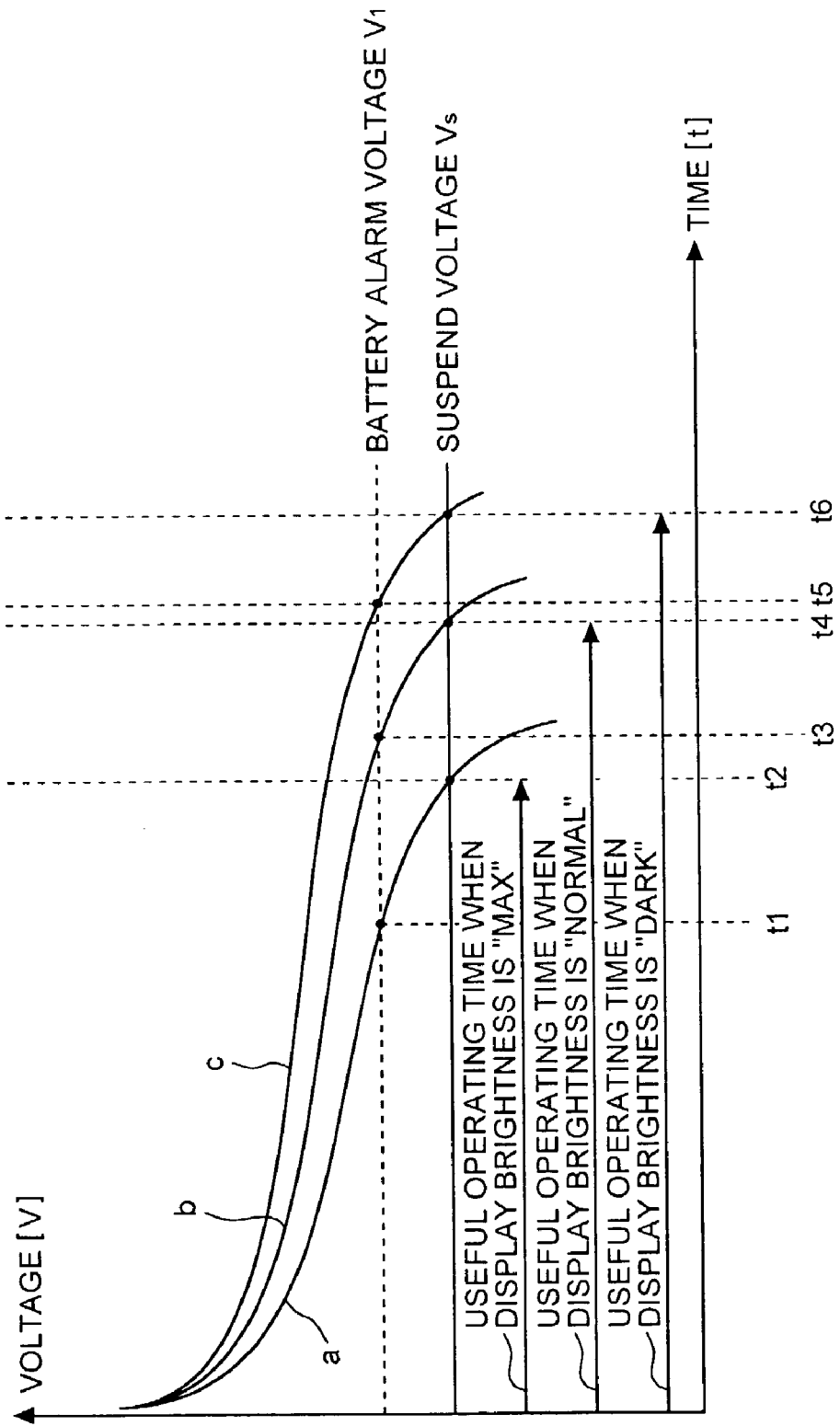
FIG. 12 shows discharge curves by respective levels of display brightness based on the conventional art.
Figure 13:
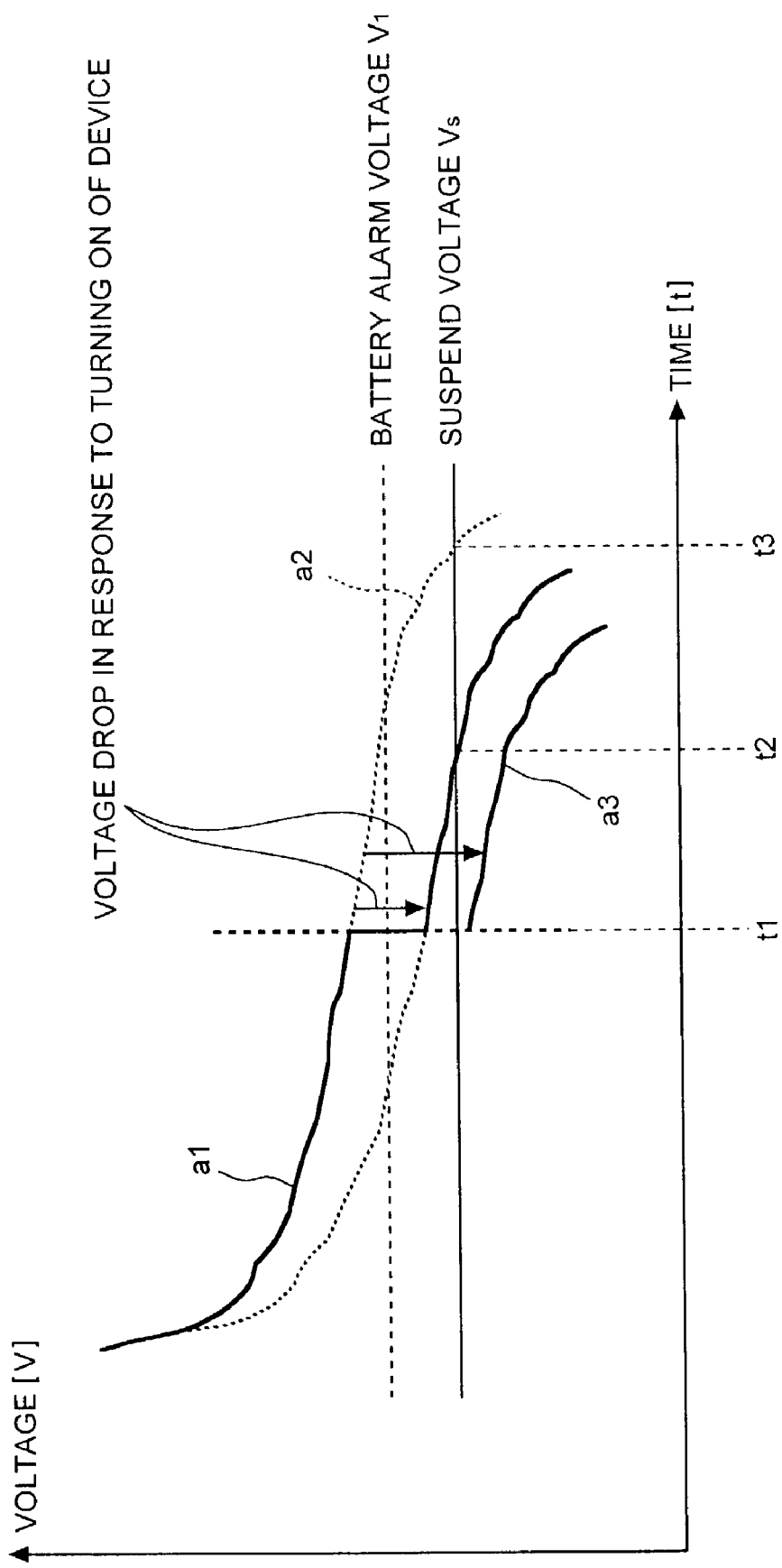
FIG. 13 shows discharge curves by respective levels of display brightness when any device is activated based on the conventional art.

FIG. 11 shows a flowchart of a fourth embodiment of this invention. The fourth embodiment is characterized in that it is determined whether the display brightness level can be increased when the battery is started to be charged or when load is reduced to control the display brightness level.

The processing sequence of a method of controlling display brightness according to the fourth embodiment will be explained below. FIG. 11 is the flowchart of the processing sequence of the method according to the fourth embodiment.

As shown in the flowchart of FIG. 11, it is determined whether the battery 210 (FIG. 2) is charged (step S800). If the battery 210 is not charged yet (step S800, No), it is determined whether the load is reduced due to turning off of the device (step S810). If it is determined that the battery 210 is charged (step S800, Yes), or if it is determined that the load is reduced (step S810, Yes), a battery voltage V' when the display brightness level is determined is obtained (step S820) and the present battery voltage V is calculated (step S830). The battery voltage V' and the present battery voltage V are calculated by the battery voltage detector 340.

At step S840, a difference between the present battery voltage V and the battery voltage V' is calculated (step S840). The determination executed at step S840 is the processing for determining whether charging the battery allows the display brightness level to be increased. More specifically, it is determined if the difference (V−V') between the present battery voltage V and the battery voltage V' is 0.2 V or higher (step S850).

If it is determined at step S850 that the difference is 0.2 V or higher (step S850, Yes), at step S860, it is controlled to return the display brightness level to the preset display brightness level, or it is controlled to increase the present display brightness level by one level (step S860).

On the other hand, at step S850, if it is determined that the difference between "V−V'" is equal to or lower than 0.2V (step S850, No), then it is controlled to maintain the present display brightness level (step S870). In other words, according to this control of the display brightness level, the present display brightness level is not changed so that the present display brightness level (brightness) is maintained as it is.

At step S860, the display brightness level has been controlled, and at step S880, it is notified that the display brightness level has been changed. As explained above, this notification is targeted to the user.

The processing at step S860 is explained below more specifically. Consider a case where the display brightness level is set to "dark" and the battery voltage V is recovered from 3.8 V to 4.0 V. A difference between the battery voltage V' when the display brightness level is determined and the present battery voltage V is calculated to obtain 0.2 V through "4.0 V−3.8 V=0.2 V" determined at step S850, and a lower value than the calculated 0.2 V is obtained. It is then controlled so that the display brightness level will be changed to the display brightness level "normal" in which a voltage drop of the battery voltage becomes 0.1 V because the present display brightness level is set to "dark" based on the display brightness level determination table 310 of FIG. 10.

As explained above, in the fourth embodiment, it is determined whether the display brightness level is increased or decreased when the battery is started to be charged or when the load is reduced due to turning off of the device to control the display brightness level. Therefore, it is possible to improve usability of users by increasing the display brightness level when the battery is fully charged.

In this embodiment, although the PDA is explained as the portable information device, this invention is also applicable to any other portable information devices such as personal computers, word processors, or game machines, each having an LCD with a backlight.

A program for realizing the configurations of the display brightness control apparatuses of the portable information device according to the first to fourth embodiments is recorded in a computer-readable recording medium to allow the computer to read and execute the recorded program. Thus, it is possible to realize the same effects as that of the methods of controlling display brightness of the portable information device according to the first to fourth embodiments, using a common computer system.

The recording medium includes a portable storage medium such as a CD-ROM, floppy disk, DVD disk, magneto-optic disk, or IC card, and a storage device such as a hard disk, and also includes database of a server that stores a program for constructing a model of an installation source connected via LAN and a transmission medium over public networks.

As explained above, according to the present invention, the display brightness level can be automatically controlled according to a remaining capacity of a battery fluctuating due to discharge of the battery. Therefore, it is advantageous that controlling the display brightness level allows power consumption to be reduced to extend a useful operating time of the portable information device without deterioration of usability of users. It is further advantageous that it is possible to prevent the portable information device from being suspended due to voltage drop of a battery in response to turning on of any device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for controlling brightness of a display unit of a portable information device, the portable information device having a battery for supplying power to at least the display unit, the apparatus comprising:

a battery voltage detecting unit that detects a voltage of the battery;

a control unit that controls the brightness of the display unit based on the voltage detected by the battery voltage detecting unit; and an estimating unit that estimates a voltage drop in the voltage detected by the battery voltage detecting unit in response to an electrical connection of a device to the portable information device, wherein the control unit controls the brightness of the display unit based on the voltage drop estimated by the estimating unit, the apparatus further comprising a memory that stores a first table of voltages of devices and name of the devices that are electrically connectable to the portable information device in a correlation form, wherein the estimating unit estimates the voltage drop based on the first table.

2. A method of controlling brightness of a display unit of a portable information device, the portable information device having a battery for supplying power to at least the display unit and a control unit for controlling the brightness of the display unit, the method comprising the steps of:

detecting a voltage of the battery;

controlling the brightness of the display unit based on the detected battery voltage; and estimating a voltage drop in the detected voltage in response to an electrical connection of a device to the portable information device, wherein at the step of controlling the brightness of the display unit is controlled by the control unit based on the estimated voltage drop, and wherein at the step of estimating the voltage drop is estimated based on a first table that stores voltages of devices and names of the devices that are electrically connectable to the portable information device in a correlation form.

* * * * *